(12) United States Patent
Poulain et al.

(10) Patent No.: US 7,343,858 B2
(45) Date of Patent: Mar. 18, 2008

(54) METHOD FOR TRACKING A REGISTERED PATTERN TO A CONTINUOUS WEB

(75) Inventors: Dana E. Poulain, Overland Park, KS (US); Ted Teuscher, Lenexa, KS (US)

(73) Assignee: Preco Industries, Inc, Lenexa, KS (US)

( * ) Notice: Subject to any disclaimer, the term of this patent is extended or adjusted under 35 U.S.C. 154(b) by 393 days.

(21) Appl. No.: 11/109,595

(22) Filed: Apr. 20, 2005

(65) Prior Publication Data

US 2006/0236885 A1  Oct. 26, 2006

(51) Int. Cl.
*B41F 1/34*  (2006.01)
(52) U.S. Cl. .................. 101/485; 101/481; 101/484
(58) Field of Classification Search .............. 101/123, 101/126, 129, 481, 483, 484, 485, 486; 400/579, 400/630
See application file for complete search history.

(56) References Cited

U.S. PATENT DOCUMENTS

| | | | |
|---|---|---|---|
| 3,276,183 A * | 10/1966 | Carlisle, Jr. et al. ............ 53/51 |
| 3,915,090 A * | 10/1975 | Horst et al. .................. 101/181 |
| 4,555,968 A | 12/1985 | Raney et al. |
| 4,697,485 A | 10/1987 | Raney |
| 5,138,667 A * | 8/1992 | Roch et al. .................. 382/112 |
| 5,212,647 A | 5/1993 | Raney et al. |
| 5,644,979 A | 7/1997 | Raney |
| 5,777,878 A | 7/1998 | Helmrich et al. |
| 6,305,857 B1 * | 10/2001 | Crowley et al. ............ 400/579 |
| 6,546,833 B1 | 4/2003 | Gifford et al. |
| 6,666,122 B2 | 12/2003 | Raney et al. |
| 6,871,571 B2 | 3/2005 | Raney et al. |
| 6,874,420 B2 * | 4/2005 | Lewis, Jr. et al. .......... 101/485 |

* cited by examiner

*Primary Examiner*—Ren Yan
(74) *Attorney, Agent, or Firm*—Hovey Williams LLP

(57) ABSTRACT

A method of applying a registered pattern to a continuous web of material involves determining a position of a next pattern such that the next pattern is in registration with a previous pattern, adjusting the position to maintain a transverse location relative to the web, and adjusting a rotation of the pattern so that the pattern is substantially aligned with a longitudinal axis of the web. Registration features of the web and registration features of the next pattern are used to determine longitudinal, transverse, and rotational errors between the registered position of the next pattern and the path of the web. The registered position of the next pattern is adjusted along a transverse axis of the web according to a transverse error to maintain the transverse location. A rotation of the registered position is adjusted according to an angle that is determined using the transverse error and a distance from a registration feature to a center of the pattern along a longitudinal axis of the pattern.

4 Claims, 7 Drawing Sheets

METHOD FOR TRACKING A REGISTERED PATTERN TO A CONTINUOUS WEB

BACKGROUND OF THE INVENTION

1. Field of the Invention

The present invention relates to the field of automated registration systems for use in continuous-web processes. More particularly, the invention relates to an automated method for applying a registered pattern to a web of material, wherein the pattern is registered relative to a previous pattern and tracks an irregular path of the web.

2. Description of the Prior Art

It is known in a variety of industries to implement a manufacturing technique that involves placing a series of parts or patterns on a continuous web of material. This technique may be used, for example, to manufacture flexible circuit boards wherein the web is a flexible substrate material and a series of circuits are printed on the substrate. When the parts are positioned at specific locations relative to each other, or relative to a determined feature, the parts are said to be produced "register" or "in registration." The most common type of registration, known as "X registration," is in the direction of movement of the web, sometimes referred to as the "machine" direction, which movement is along a longitudinal or X axis of the web, as shown in FIG. 1. FIG. 2 illustrates patterns that are printed on a web in X registration. Solutions for accomplishing X registration are well known in the art and include, for example, mechanical methods such as tractor feeds and optical methods such as fiber-optic sensors or imaging systems.

In some cases, it is required that the registration be in the machine direction as well as the orthogonal, or transverse, direction. Further, it may also be required that the patterns be aligned rotationally (wherein an angle of rotation is commonly denoted by the symbol $\Theta$). Transverse registration, also referred to as XY registration, and rotational registration, also referred to as XY$\Theta$ registration, are well-known in the art and are implemented in various industries. FIG. 3 illustrates patterns that are in XY registration, that is, the position of each pattern is varied relative to a position of a previous pattern along both a longitudinal (X) axis and a transverse (Y) axis. FIG. 4 illustrates patterns that are in XY$\Theta$ registration, that is, the position of each pattern is not only varied relative to a position of a previous pattern along the X axis and the Y axis, but also is rotated relative to the previous pattern. XY$\Theta$ registration is known in the art and is described, for example, in U.S. Pat. Nos. 5,644,979, 5,212,647, 4,555,968 and 4,697,485.

Unfortunately, prior art methods of applying XY and XY$\Theta$ registration suffer from various problems and limitations. Webs, for example, often do not follow a straight path but are arbitrarily curved, in which case the web will tend to one side or the other during the manufacturing process. Eventually, a path followed by the parts will diverge from a path followed by the web such that the parts cannot be completely contained by the web, as illustrated in FIG. 5.

Accordingly, there is a need for an improved method of applying a series of registered patterns to a continuous web of material that follows an irregular path that overcomes the problems and limitations of the prior art.

SUMMARY OF THE INVENTION

The present invention solves the above-described problems and provides a distinct advance in the art of continuous-web manufacturing. More particularly, the present invention provides a method of placing patterns on a continuous web such that each pattern is in registration with a previous pattern and follows an irregular path of the web, thus ensuring that a path of the patterns does not diverge from a path of the web.

A first aspect of the invention involves capturing images of at least two registration features of a previous object on a continuous web and then applying a registered object to the web comprising the steps of determining a position of a next object such that the next object is in registration with the registration features of the previous object, adjusting a transverse element of the position such that the next object is at a same transverse position relative to the web as the previous object, and adjusting a rotational element of the position such that the next object is substantially aligned with a longitudinal axis of the web.

According to a second aspect of the invention, at least two images of the web are captured, wherein each image includes at least one registration feature of a previous object. Registration corrections are computed based on the registration features, wherein the registration corrections maintain registration between a next panel and a previous panel. A transverse path correction is computed for maintaining the next panel at a same transverse location relative to the web as the previous panel, wherein the transverse path correction is limited to a user-defined maximum if the transverse correction exceeds the limit.

A rotational path correction is computed for aligning the next panel to a longitudinal axis of the web, wherein the rotational path correction is limited to a user-defined maximum if the rotational correction exceeds the limit. A composite set of corrections are then computed by combining the transverse path correction and the rotational path correction with the registration corrections.

According to a third aspect of the invention, registration corrections are computed, wherein the registration corrections correspond to longitudinal and transverse axes of the web and a rotational axis of the pattern. The registration corrections serve to maintain registration between a next panel and a previous panel, are based on the registration features, and are computed by averaging longitudinal and transverse errors for each of the registration features and determining a rotational error by determining an angle associated with the longitudinal error and the transverse error.

A transverse correction is then computed, wherein the transverse correction is necessary to maintain the next panel at a same transverse location relative to the web as the previous panel, wherein the transverse correction is computed using a transverse error associated with one of the registration features. The transverse path correction is limited to a user-defined maximum if the transverse path correction exceeds the limit.

A rotational path correction is computed to substantially align the next panel with a longitudinal axis of the web, wherein the rotational path correction is computed by determining an angle associated with a transverse error and a distance from a registration feature to a center of the pattern along a longitudinal axis of the pattern. The rotational path correction is limited to a user-defined maximum if the rotational path correction exceeds the limit.

A composite set of corrections are computed by combining the transverse path correction and the rotational path correction with the registration corrections, and a final set of corrections are computed by adjusting the composite set of corrections according to a user-specified set of adjustments. The next pattern is then produced on the web according to the final set of corrections.

These and other important aspects of the present invention are described more fully in the detailed description below.

BRIEF DESCRIPTION OF THE DRAWING FIGURES

A preferred embodiment of the present invention is described in detail below with reference to the attached drawing figures, wherein.

DETAILED DESCRIPTION OF THE PREFERRED EMBODIMENTS

Figure 1:
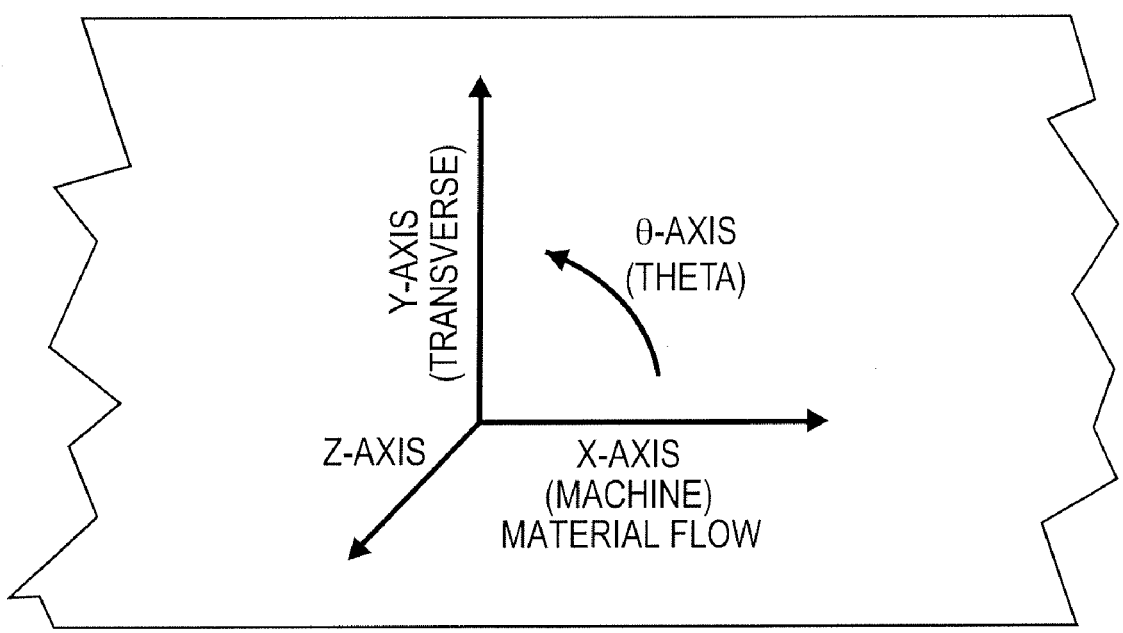
FIG. 1 is a diagram illustrating various axes of a web of material used in a method of tracking a registered pattern to a continuous web of the present invention.
Figure 2:
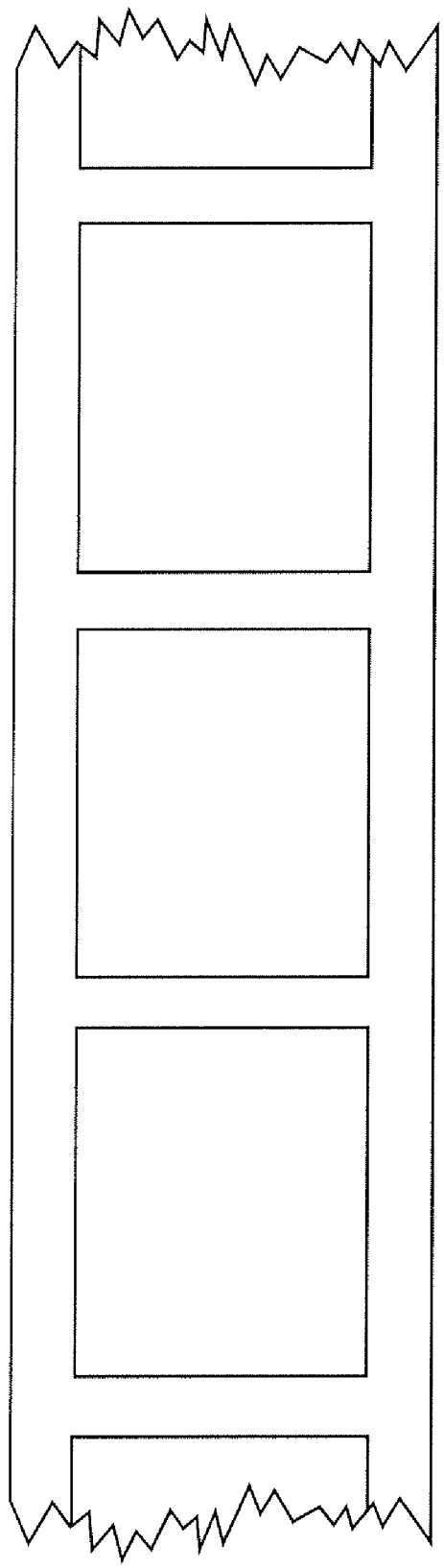
FIG. 2 illustrates a series of patterns placed in X registration on the web of FIG. 1 in a manner known in the art.
Figure 3:
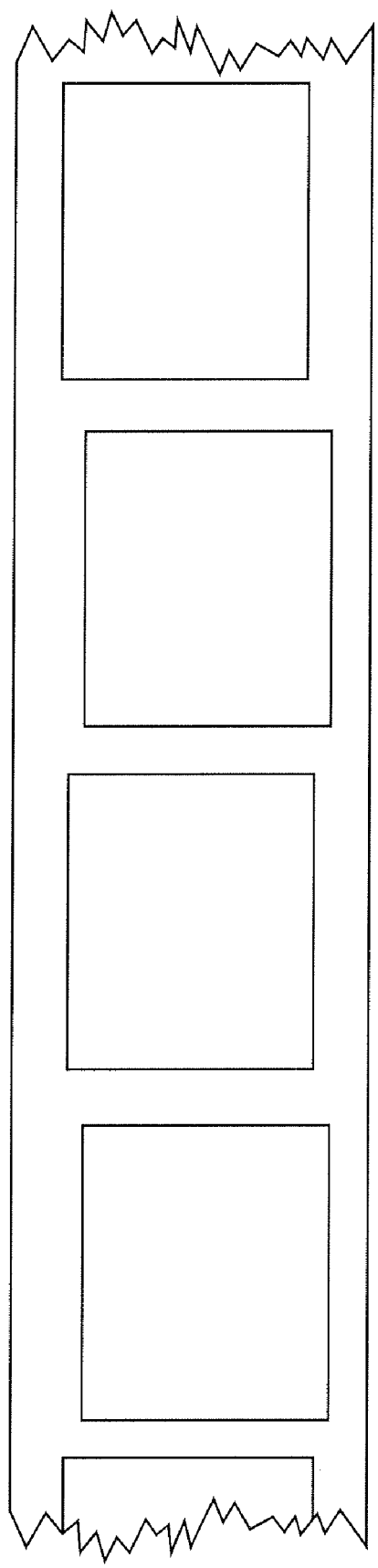
FIG. 3 illustrates a series of patterns placed in XY registration on the web of FIG. 1 in a manner known in the art.
Figure 4:
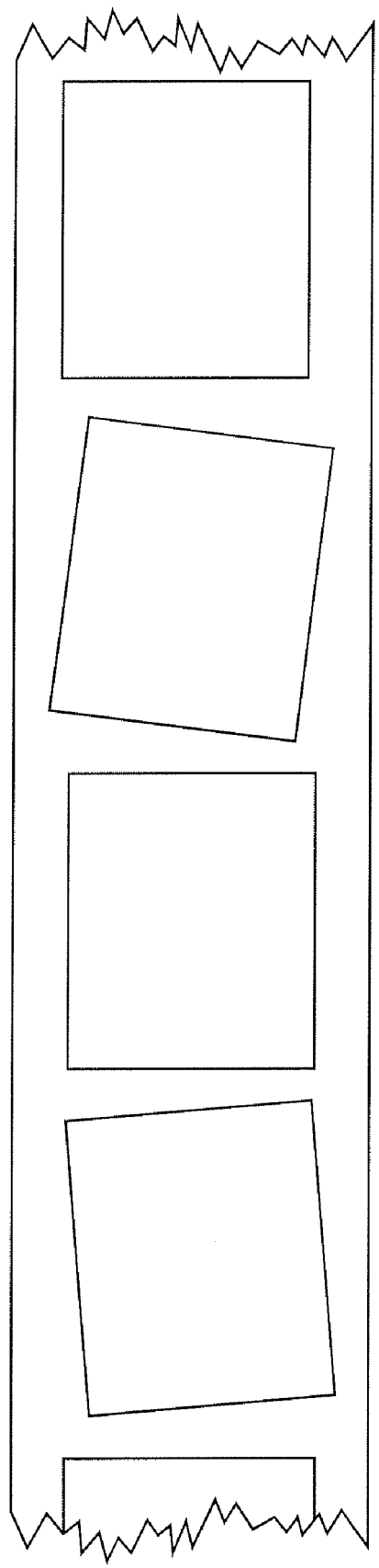
FIG. 4 illustrates a series of patterns placed in XYΘ registration on the web of FIG. 1 in a manner known in the art.
Figure 5:
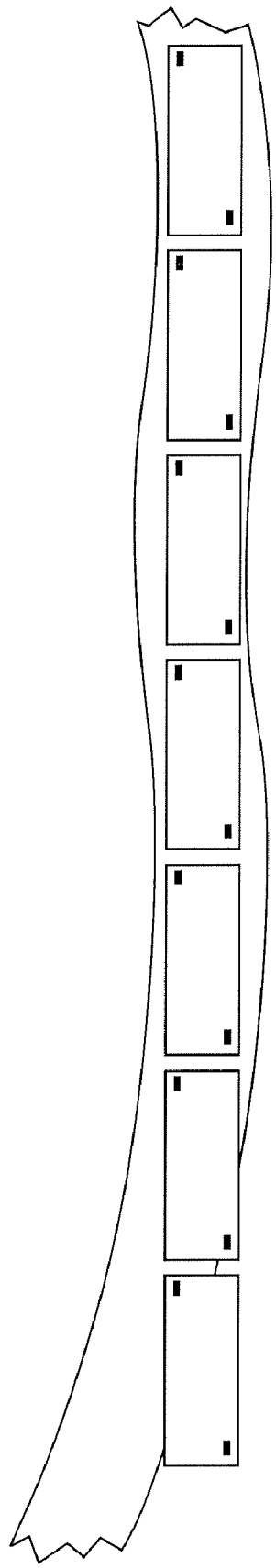
FIG. 5 illustrates a series of patterns placed on a web according to a prior art registration process, wherein the registered patterns follow a path that diverges from a path of the web.
Figure 6:
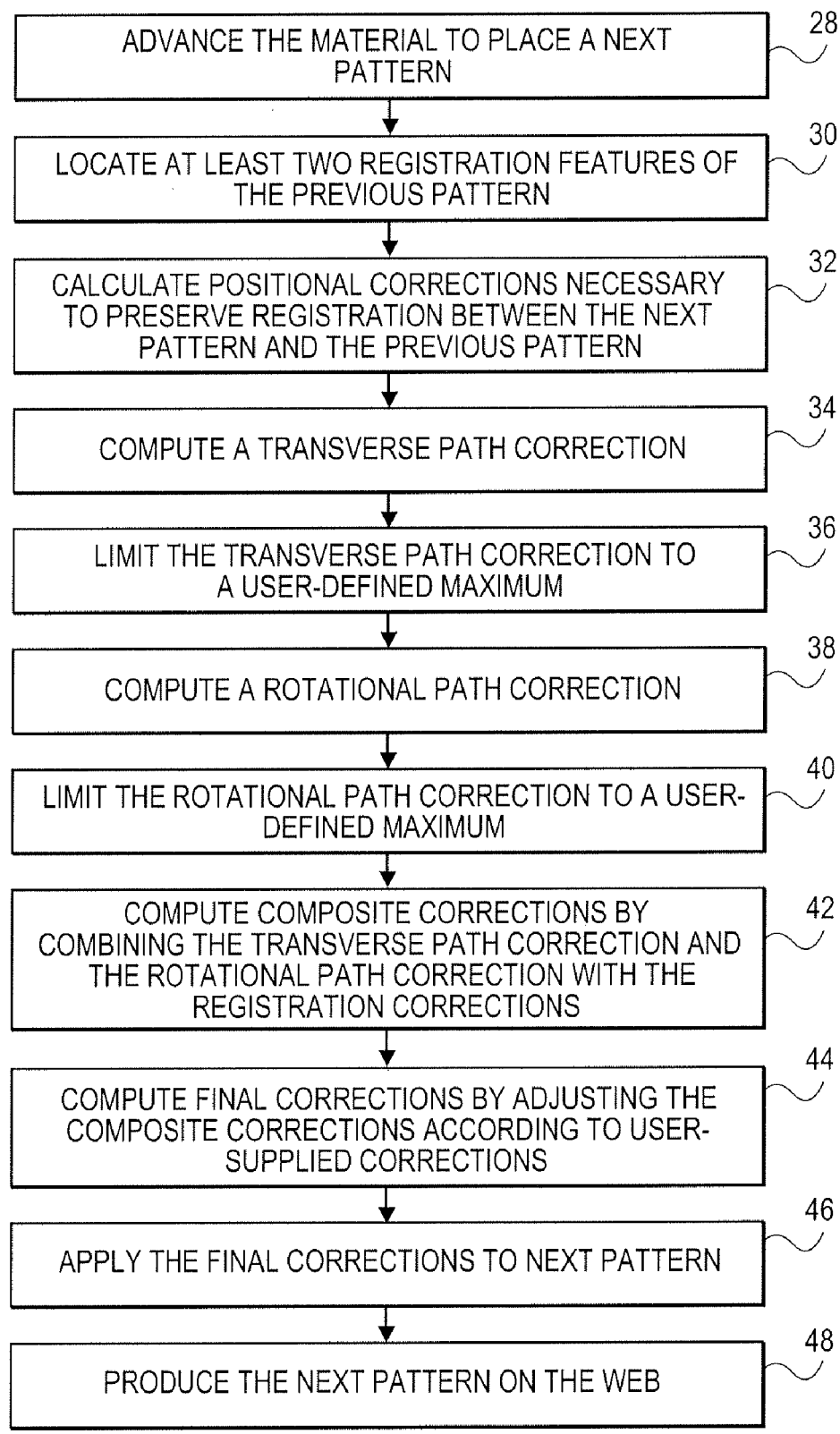
FIG. 6 is a flowchart of steps involved in the method of tracking a registered pattern to a continuous web of the present invention.

A flowchart of steps involved in a method of processing a registered object on a continuous web of material according to principles of the present invention is illustrated in FIG. 6. The method is useful to process a next object on the web, wherein the next object is in registration with a previous object and tracks an irregular path of the web. While the method is specifically described as being implemented in a system that prints a series of patterns on a continuous web of material, it will be readily appreciated by one skilled in the art that the present invention is also useful in a variety of other systems that process objects in registration. The invention may be used, for example, in cutting or lamination systems that process objects on strips of material. Exemplary systems that may benefit from the method of the present invention include systems taught in U.S. Pat. Nos. 6,871,571, 6,546,833 and 5,777,878, herein incorporated into the present application by reference.

Figure 7:
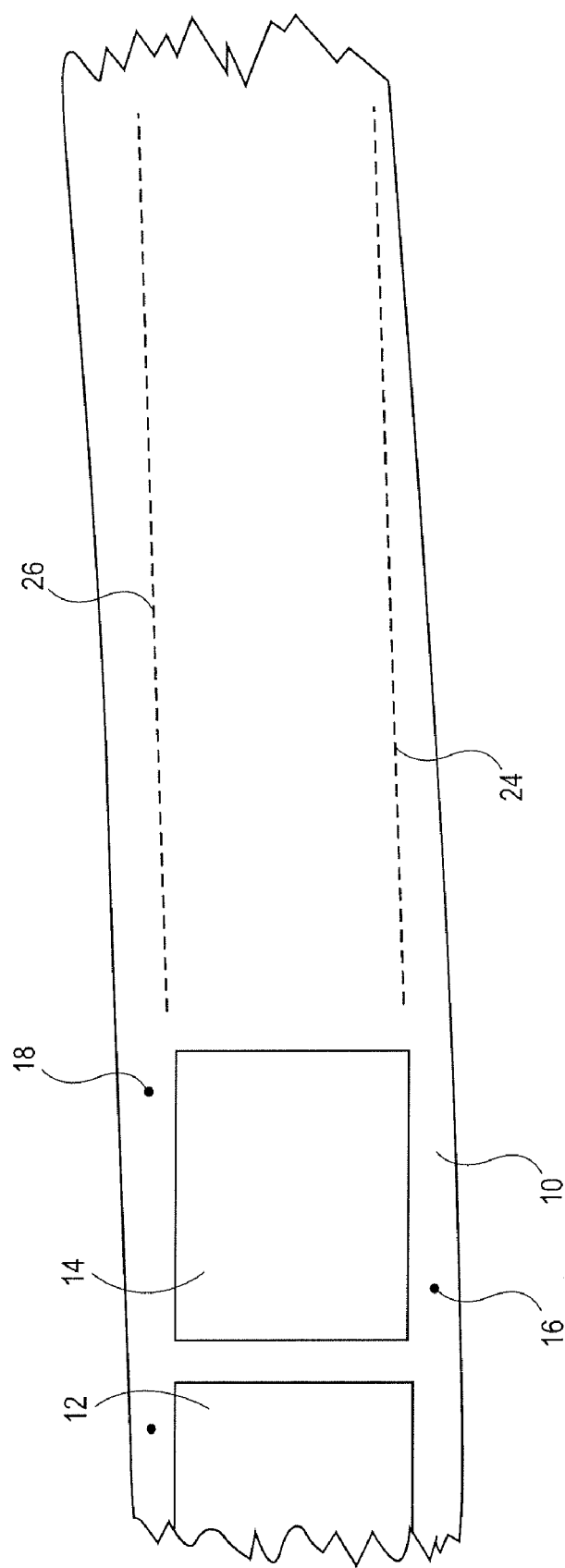
FIG. 7 is an exemplary web following an irregular path on which patterns are placed to preserve a registration and to follow the path of the web according to the method of FIG. 1.

A portion of an exemplary web of material 10 useful with the present invention is illustrated in FIG. 7, wherein two patterns 12, 14 have been printed on the web 10 and the web 10. The pattern 14 is produced in register with pattern 12 and includes registration features 16 and 18. Dashed lines 24, 26 show a projected path followed by subsequent patterns (not shown) if printed according to the registration scheme used to print the patterns 12,14. As can be seen, the projected path of subsequent patterns gradually diverges from a path of the web 10 and would eventually separate from the web 10 if not corrected.

According to a first embodiment of the present invention, the web of material 10 is first advanced through a processing system in preparation for placing a next pattern on the web 10, as depicted in block 28 of FIG. 6. The next pattern will be placed generally in register to features 16,18 in a manner to not only preserve registration with a previous pattern, such as pattern 14, but also to track a path of the web 10, as explained below.

As the web of material 10 is advanced through the system, the system locates at least two registration features 16,18 of the web 10, as depicted in block 30. Preferably, the system locates the features 16,18 via a machine vision system that captures one or more images of the registration features and processes the images to identify and locate each of the features 16,18. Each of the visible registration features 16,18 must present sufficient contrast to enable the machine vision system to resolve the feature. Furthermore, each of the registration features 16,18 must be small enough to allow features 16,18 to fit within the field of view of the machine vision cameras. While the exemplary registration features 16,18 are substantially circular and placed proximate corners of each pattern, it will be appreciated that the invention is not so limited and that any number of registration features of various shapes and sizes may be used and may be placed at various places on the web 10.

The system then calculates positional corrections necessary to preserve registration between the next pattern and the previous pattern 14, as depicted in block 32. The system calculates the positional corrections by comparing actual positions of the features 16,18 to expected positions of the registration features. A positional difference, or error, between the actual location of registration features 16,18 and the expected registration feature locations is determined in both the longitudinal (X) and transverse (Y) directions. Corrections along the X axis ($X_c$) and the Y axis ($Y_c$), and about the Θ axis ($Θ_c$) are computed according to the following equations:

$$X_c = (X_{E1} + X_{E2}) \times K \times \tfrac{1}{2}$$

$$Y_c = (Y_{E1} + Y_{E2}) \times K \times \tfrac{1}{2}$$

$$Θ_c = \arctan((X_{E2} - X_{E1}) \div (Y_{E1} - Y_{E2}))$$

In the above equations, the variable $X_{E1}$ represents the error associated with the first registration mark along the X axis, the variable $X_{E2}$ represents the error associated with the second registration mark along the X axis, the variable $Y_{E1}$ represents the error associated with the first registration mark along the Y axis, and the variable $Y_{E2}$ represents the error associated with the second registration mark along the Y axis. The variable K represents a conversion factor for converting a distance value in pixels to a distance value in standard units, such as centimeters or inches. The steps of the method described thus far allow the next pattern to be placed in registration with the previous pattern. As explained below, the positional corrections $X_c$, $Y_c$ and $Θ_c$ are further modified with path corrections to allow the next pattern to follow an arbitrarily curved path of the web 10.

One of the registration features 16,18 is used to determine a transverse path correction, as depicted in block 34. The transverse path correction, denoted "$Y_d$," maintains the next pattern at the same transverse location relative to the web 10 as the previous pattern 14. If a registration feature of the previous pattern 14 is located two centimeters from an edge of the web 10, for example, the transverse correction places an analogous registration feature of the next pattern two centimeters from the edge of the web 10. The transverse correction ($Y_d$) is defined by the following equation:

$$Y_d = -1 \times Y_{E2} \times K$$

The calculated value $Y_d$ is limited to a user-defined maximum transverse correction value, as depicted in block 36. $Y_d$ is compared to the maximum transverse correction value and is adjusted to equal the maximum value if it is greater than the maximum value. If $Y_d$ is less than or equal to the maximum value, it is not adjusted. A user may submit the maximum transverse correction value prior to beginning the process or may submit and/or update the value during the process.

A rotational path correction $\Theta_d$ is then computed to align the next pattern with a longitudinal axis of the web 10, as depicted in block 38. If the web 10 is following a curved path as illustrated in FIG. 7, for example, the next pattern should be rotated to generally follow the curved path. In the illustrated web 10, the next pattern should be rotated counterclockwise so that a longitudinal axis of the pattern is substantially parallel with the longitudinal axis of the web at or near a center of the next pattern. The rotational path correction $\Theta_d$ is defined by the following equation:

$$\Theta_d = \arctan((Y_{E2} \times K) \div X_{center})$$

In the above equation, the variables $Y_{E2}$ and $K$ are the same as those discussed above, and the variable $X_{center}$ is a distance from a registration feature to a center of the pattern along the longitudinal axis of the web 10. This value is predetermined and is substantially identical for all patterns placed on the web 10.

The calculated value $\Theta_d$ is limited to a user-defined maximum rotational correction value, as depicted in block 40. $\Theta_d$ is compared to the maximum value, for example, and is adjusted to equal the maximum value if it is greater than the maximum value. If $\Theta_d$ is less than or equal to the maximum amount, it is not adjusted. A user may submit the maximum transverse correction value prior to beginning the process or may submit and/or update the value during the process.

A set of composite corrections is then computed by combining the registration corrections with the path corrections, as depicted in block 42. The composite corrections maintain registration and track the next pattern to the path of the web 10. A composite correction is computed for each axis as follows:

$$X_{COMP} = X_c$$

$$Y_{COMP} = Y_c + Y_d$$

$$\Theta_{COMP} = \Theta_c + \Theta_d$$

The user is given the opportunity to apply additional corrections in any of the three axes, as depicted in block 44. The total corrections include a user-specified correction for each axis, and are defined as follows:

$$X_{TOTAL} = X_{COMP} + X_{USER}$$

$$Y_{TOTAL} = Y_{COMP} + Y_{USER}$$

$$\Theta_{TOTAL} = \Theta_{COMP} + \Theta_{USER}$$

In the above equations, the variables $X_{USER}$, $Y_{USER}$ and $\Theta_{USER}$ are the corrections submitted by the user corresponding to the X axis, Y axis and $\Theta$ axis, respectively.

The final corrections are then applied to the next pattern, as depicted in block 46. Each pattern may comprise a series of objects including, for example, lines, circles, and arcs (not shown). Each object of the pattern is defined by a start point and end point, therefore total corrections are applied to each start point and each end point of each object of the next pattern to define an X component, a Y component and a $\Theta$ component of the starting point and the ending point of each object to be drawn on the web.

With the total corrections thus applied to each object of the next pattern, the next pattern is printed on the web, as depicted in block 48. When the system has completed producing the next pattern, the system produces a subsequent pattern by repeating the steps of the method.

Although the invention has been described with reference to the preferred embodiments illustrated in the attached drawings, it is noted that equivalents may be employed and substitutions made herein without departing from the scope of the invention as recited in the claims. It will be appreciated, for example, that the system may locate registration features via a method other than machine vision such as, for example, a method that employs photodiodes to detect contrasting marks on the web.

Having thus described the preferred embodiment of the invention, what is claimed as new and desired to be protected by Letters Patent includes the following:

1. A method of applying a registered pattern to a continuous web of material comprising the steps of:
   (a) capturing an image of the web, wherein the image includes at least two registration features;
   (b) computing registration corrections based on the registration features, wherein the registration corrections maintain registration between a next panel and a previous panel;
   (c) computing a transverse path correction necessary to maintain the next panel at a same transverse location relative to the web as the previous panel;
   (d) limiting the transverse path correction to a user-defined maximum if the transverse path correction exceeds the maximum;
   (e) computing a rotational path correction to substantially align the next panel with a longitudinal axis of the web;
   (f) limiting the rotational path correction to a user-defined maximum if the rotational correction exceeds the maximum;
   (g) computing a composite set of corrections by combining the transverse path correction and the rotational path correction with the registration corrections
   (h) computing a final set of corrections by adjusting the composite set of corrections according to a user-specified set of adjustments; and
   (i) producing the next pattern on the web according to the final set of corrections.

2. The method as set forth in claim 1, step (b) further comprising the step of:
   (b1) computing the registration corrections by averaging longitudinal and transverse errors associated with each of the registration features and by determining an angle associated with the longitudinal and transverse errors.

3. The method as set forth in claim 1, step (c) further comprising the step of:
   (c1) computing the transverse path correction using a transverse error associated with one of the registration features.

4. The method as set forth in claim 1, step (e) further comprising the step of:
   (e1) computing the rotational path correction by determining an angle associated with a transverse error and a distance from a registration feature to a center of the pattern along a longitudinal axis of the pattern.

* * * * *